(12) United States Patent
Rokugo

(10) Patent No.: US 6,496,553 B1
(45) Date of Patent: Dec. 17, 2002

(54) PLL FOR REPRODUCING STANDARD CLOCK FROM RANDOM TIME INFORMATION

(75) Inventor: Yoshinori Rokugo, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/215,339

(22) Filed: Dec. 18, 1998

(30) Foreign Application Priority Data

Dec. 19, 1997 (JP) .............................................. 9-351193

(51) Int. Cl.[7] .............................. H03L 7/08; H03D 3/24
(52) U.S. Cl. ........................................ 375/376; 327/156
(58) Field of Search .................................. 375/376, 327; 327/147, 151, 156, 160, 146, 155; 331/1 A, 1 R, 17, 18, 25; 455/260; 713/400, 500, 502

(56) References Cited

U.S. PATENT DOCUMENTS

| 5,629,649 A | 5/1997 | Ujie |
| 5,864,248 A | * 1/1999 | Rokugo ....................... 327/156 |
| 5,995,156 A | 11/1999 | Han et al. .................... 348/500 |

FOREIGN PATENT DOCUMENTS

| EP | 0 776 094 | 5/1997 |
| JP | 62-72224 | 4/1987 |
| JP | 62-298227 | 12/1987 |
| JP | 2-142231 | 5/1990 |
| JP | 3-16318 | 1/1991 |
| JP | 3-124111 | 5/1991 |
| JP | 4-72817 | 3/1992 |
| JP | 5-268076 | 10/1993 |
| JP | 8-161829 | 6/1996 |
| JP | 8-321772 | 12/1996 |
| JP | 9-163363 | 6/1997 |
| JP | 9-172373 | 6/1997 |
| JP | 9-191417 | 7/1997 |
| JP | 9-205564 | 8/1997 |
| JP | 9-261237 | 10/1997 |
| JP | 10-276431 | 10/1998 |

OTHER PUBLICATIONS

Garodnick, Joseph, et al., "Response of an all Digital Phase–Locked Loop", IEEE Transactions on Communication, vol. COM–22, No. 6, Jun. 1974.

* cited by examiner

Primary Examiner—Betsy L. Deppe
(74) Attorney, Agent, or Firm—Foley & Lardner

(57) ABSTRACT

A PLL is provided for reproducing a standard clock having a constant Jitter band from a random time information. This PLL is composed of a receiving counter 4-1 for counting the standard clock received from the transmitting side; a subtractor 4-3 for comparing between the count value of the receiving counter 4-1 which is read out each time when the receiving counter receives the count value from the transmitting counter; a differential time calculator for calculating a difference between the present count value and the preceding count value of the receiving counter; a first attenuator 4-5 for attenuating the output of the subtractor; a second attenuator 4-6 for further attenuating the output of the first attenuator; an integrator 4-7 for integrating the output of the second attenuator based on the differential time calculated by the differential time calculator; an adder 4-8 for adding the outputs of the adder and the integrator; a converter 4-9 for converting the result of the adder into a voltage signal; and a voltage control oscillator 4-10 for outputting a signal to the receiving counter based on the input of the voltage signal converted by the converter.

17 Claims, 5 Drawing Sheets

PLL FOR REPRODUCING STANDARD CLOCK FROM RANDOM TIME INFORMATION

BACKGROUND OF THE INVENTION

1. Field of the Invention

The present invention relates to a phase locked loop (hereinafter, called PLL), and particularly relates to a digital PLL for reproducing the standard clock at a receiving side in a transfer system of the standard clock used for image coding for systems larger than current TV systems such as MPEG 2 (Motion Picture Experts Group 2).

2. Background Art

According to the specification of MPEG of the International Organization for Standardization (ISO), wherein the digital transfer systems of the dynamic image are under investigation, a transmitting side transmits a numerical information corresponding to a count of a transmitting counter by reading the count at random time intervals, while, a PLL at the receiving side reproduces a standard clock synchronized with that of the transmitting side based on numerical information obtained as a difference by comparing between the numerical information at the transmitting side and the count of the standard clock obtained by counting at the receiving side. A digital signal processing-type PLL is known as a circuit for reproducing the standard clock from the second numerical information.

Experimental and simulation results including of a first order-, a second order- and third order- all digital type PLLs are reported in a paper entitled "Response of an All Digital Phase-Locked Loop" by Joseph Garodnick et al. in 'IEEE transactions on Communication, vol. COM-22, No. 6, June 1974'.

The operation of this digital signal processing-type DPLL (Digital PLL) will be described hereinafter referring to a block diagram shown in FIG. 7.

An input of a receiving FM wave including noise is turned into X(t) as a wave with a restricted band by passing a band-pass filter BPF having a band width B, and after sampling, X(t) is subsequently turned into a digital signal Xk after conversion into binary codes by an A/D converter. The digital signal Xk generates a phase error signal Ek by inputting the signal with an output Wk of VCO (Voltage Controlled Oscillator) into a multiplier which corresponds to a phase comparator. The phase error signal Ek is turned into a control signal Yk by passing it through a digital filter and determining the output Wk+1 of the new VCO. While, after the control signal Yk is converted into a step-wise signal by a D/A converter as the output of the loop, the control signal is taken out as an analog signal Y(t) by LPF (Low Pass Filter). There are various types of digital filters such as a linear pass type-, a linear plus integral pass type-, and a linear plus integral plus double integral pass type-filters, and these filters are called first order-, second order-, and third order- DPLLs.

In the conventional digital signal processing type PLL, a problem arises that, since the transmitting clock information is processed assuming that the information is sampled at a fixed cycle, jitter suppression characteristics of the system become unstable when PLL is driven by information sampled at random time intervals, which results in deteriorating the transmission quality.

That is, in the digital signal processing type-DPLL, calculation is performed using a fixed differential time, since essential elements such as the primary low pass filter and the integrator are formed by a delay element having a fixed delay time of Ts second. However, when sampling intervals w are random, since scattering of the arrival time of numerical information causes fluctuation of the delay time each time and fluctuation of the time constant of the delay element, the jitter suppression characteristic of the system becomes unstable.

Therefore, it is an object of the present invention to provide a PLL capable of reproducing the standard clock which is fixed in a stable jitter band from the random time information.

SUMMARY OF THE INVENTION

The present invention is directed from a point that an equation 1, which represents the time integral, $$y=\int f(t)dt \tag{1}$$

can be replaced with an equation 2.

$$y=\Sigma f(i) \Delta t \tag{2}$$

That is, the delay line of the present invention is capable of operating in response to random time information by using $\Delta t$ obtained from a differential time between the present count T(i) and the preceding count T(i-1) as an operator for each constituting elements.

The perfect second order PLL according to the present invention comprises a receiving counter, which has the same structure with that of a counter at the transmitting side, for counting the received standard clock;

a memory for storing the output of the receiving counter;

a subtractor, which reads the counted value of the counter at the receiving side each time the counted value of the transmitting side is transmitted to the receiving side, for comparing between the counted value transmitted and the counted value of the counter at the receiving side;

a differential time calculator for calculating a differential time between the present counted value and the preceding counted value of the receiving counter at the receiving side;

a first attenuator for attenuating the output gain of the subtractor;

a second attenuator for attenuating the output of the first attenuator;

an integrator for integrating the output of the second attenuator based on the differential time calculated by the differential time calculator;

an adder for adding the output of the first attenuator to the output of the integrator;

a converter for converting the result of the adder into a voltage signal;

a voltage oscillator for converting and receiving said voltage signal of the output of the converter, and converting into a control signal for outputting into the receiving counter.

FIG. 2 shows a third order PLL according to the present invention having a primary low pass filter which receives the output of the subtractor of the second order PLL and the output of the differential time calculator and inputs its output to the first attenuator.

Operations and actions of the present device will be described hereinafter for a case of the primary low pass filter.

FIG. 4 shows a structure of the primary low pass filter, FIG. 5 shows its extended view in the Z plane, and FIG. 6 shows a frequency response characteristic of this circuit.

As shown in FIG. 4, the primary low pass filter can be constructed by an RC circuit. The frequency transfer characteristic $Y(j\omega)$ is expressed by, $$Y(j\omega)=1/(j\omega RC+1) \quad (3)$$

that is, on the S plane, the equation in turned into, $$Y(S)=1/(S/A+1) \quad (4)$$

where, A is a gain of this system, which is a reciprocal of the time constant 1/RC.

When this transfer characteristics is extended on the Z plane, S is expressed as, $$S=(1-Z^{-1})/\Delta t \quad (5)$$

Here, $Z^1$ represents a delay element, and the delay is generated expressed by, $\Delta t=T(i)-T(i-1)$, and a datum received at the time of $T(i-1)$ is output in $T(i)$.

When the equation (5) is substituted into the equation (4), the following equation is obtained.

$$Y(Z)=a\cdot b/(1-b\cdot Z^{-1}) \quad (6)$$

where, $a=A\cdot\Delta t$, $b=1/(1+A\cdot\Delta t)$.

The frequency response characteristic extended on the Z plane shown in FIG. 6 is obtained by setting the maximum sampling intervals as 0.1 sec. The frequency response characteristic in a frequency range less than 10 Hz obtained when $\Delta t$ is set at 0.01 sec is coincides with the characteristic shown by the equation (3).

It was confirmed that a uniform characteristic is obtained in a frequency range less than 4 Hz, even if $\Delta t$ fluctuates.

It is to be understood that, although a peak is observed at a frequency of 5 Hz and at $\Delta t=0.1$ sec, it does not cause any problem because the significant frequency range is less than a half of the sampling frequency as decided by the sampling theory.

DESCRIPTION OF PREFERRED EMBODIMENTS

Preferred embodiments of the present invention will be described hereinafter with reference to attached drawings.

Figure 1:
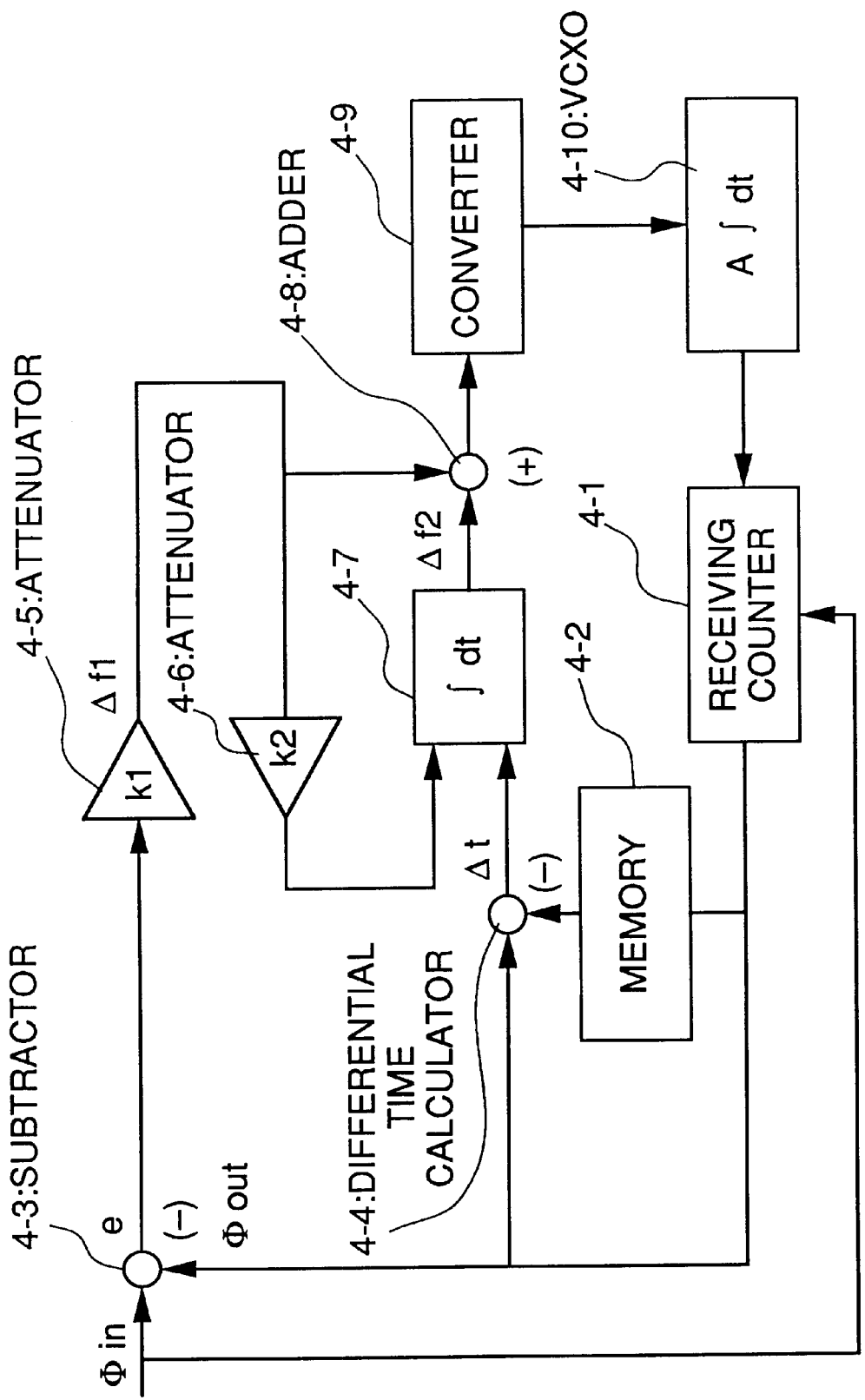
FIG. 1 is a block circuit diagram showing a secondary type PLL according to the first embodiment of the present invention.

As shown in FIG. 1, the secondary type PLL according to the first embodiment of the present invention is a standard clock transfer system which, at a transmitting side, reads out counted values of the standard clock at a random time intervals less than a time interval of T and transfers the time information obtained at the transmitting side. This PLL device comprises a receiving counter 4-1, which has the same structure as that of the counter at the transmitting side, for counting the standard clock received by the receiving side; a memory 4-2 for storing an output of the receiving counter for a predetermined period; a subtractor 4-3 for comparing between a counted value of the receiving counter 4-1 and the received count value by reading out the counted value of the receiving counter 4-1 whenever the counted value of the counter of the transmitting side is transmitted; a differential time calculator 4-4 for calculating the differential time between the present count value and a preceding count value of the receiving counter 4-1; a first attenuator 4-5 for attenuating the output gain of the subtractor 4-3; a second attenuator 4-6 for further attenuating the output of the first attenuator 4-5; an integrator 4-7 for integrating an output of the second attenuator 4-6 based on the differential time obtained by the differential calculator 4-4; an adder for adding an output of the first attenutor 4-5 to an output of the integrator 4-7; a converter 4-9 for converting the added value of the adder 4-9 into a voltage signal; and a voltage control oscillator 4-10 for inputting the voltage signal converted by the converter 4-9 and for outputting to the receiving counter 4-1.

Figure 2:
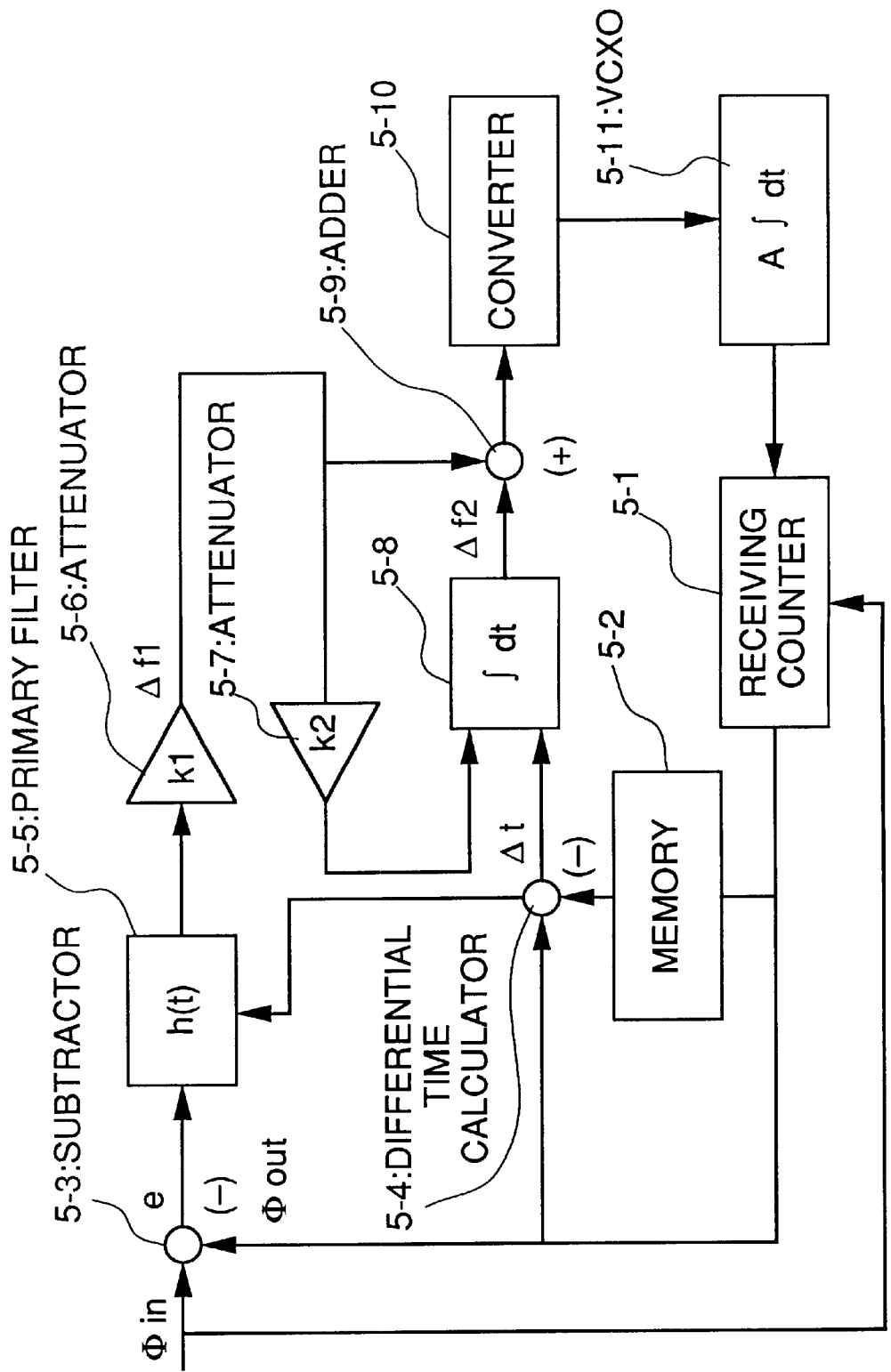
FIG. 2 is a block circuit diagram showing a tertiary type PLL according to the second embodiment of the present invention.

FIG. 2 shows a third order type PLL, which comprises a receiving counter 5-1 for counting the received standard clock, a memory 5-2 for storing the output of the receiving counter, a subtractor 5-3 for obtaining a difference between the standard clock and the reproduced clock by comparing both clocks, a differential time calculating means 5-4 for calculating a difference time between a present count value and a preceding count value, a primary low pass filter 5-5 which uses the differential time as an operator, a first attenuator 5-6 attenuating an output of the primary low pass filter, a second attenuator 5-7 for further attenuating an output of said first attenuator 5-5; an integrator 5-8 for integrating an output of said first attenuator by using the differential time obtained by said differential time calculator 5-4 as an operator, an adder 5-9 for adding the outputs of the first attenuator 5-5 and the integrator 5-8, a converter 5-10 for converting the result of the addition into a voltage signal, a voltage control oscillator 5-11 for reproducing the standard clock at the receiving side by inputting the converted voltage signal and outputting to the receiving counter 5-1 for performing feed-back the reproduced standard clock to the receiving standard counter.

Figure 3:
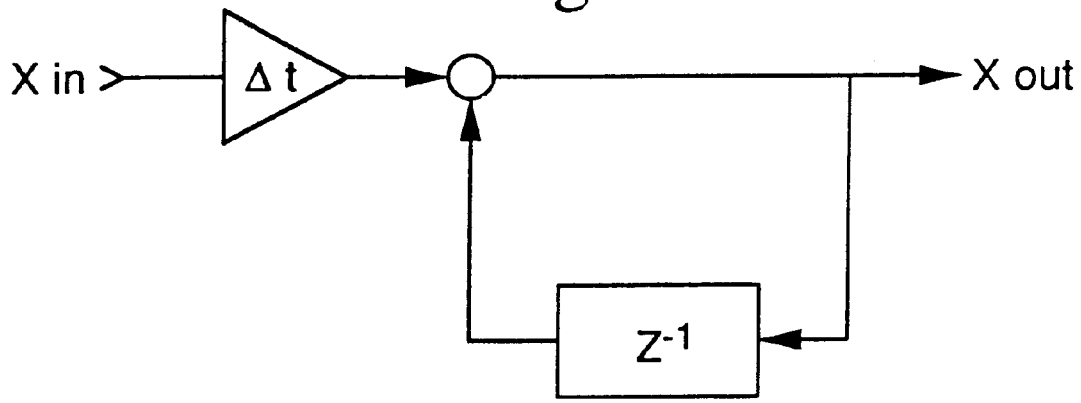
FIG. 3 shows a integrator which operates by the differential time intervals.
Figure 4:
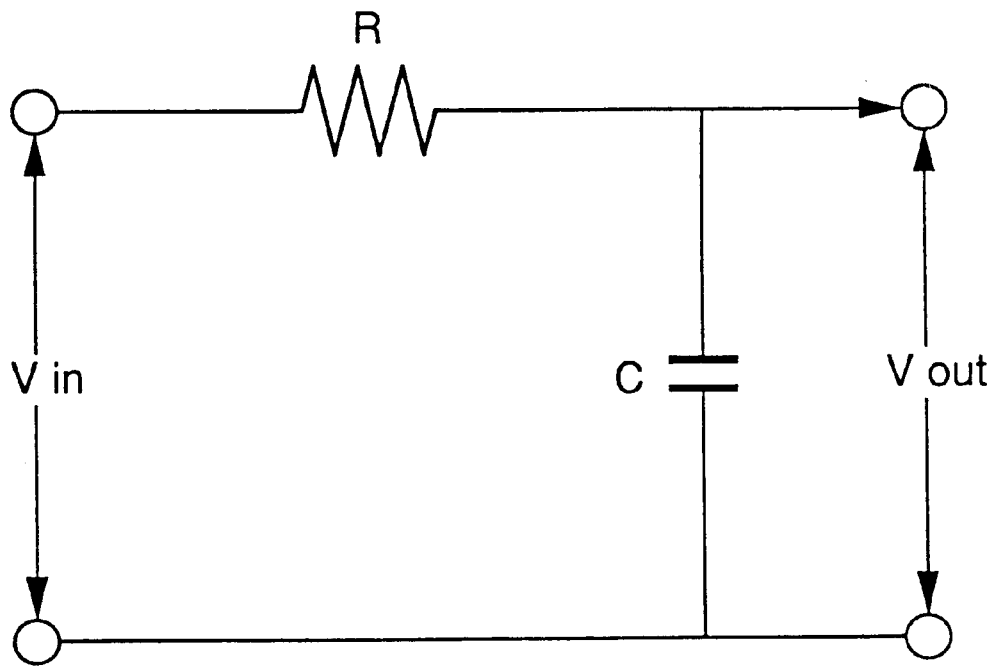
FIG. 4 shows a block circuit diagram of a primary low pass filter.
Figure 5:
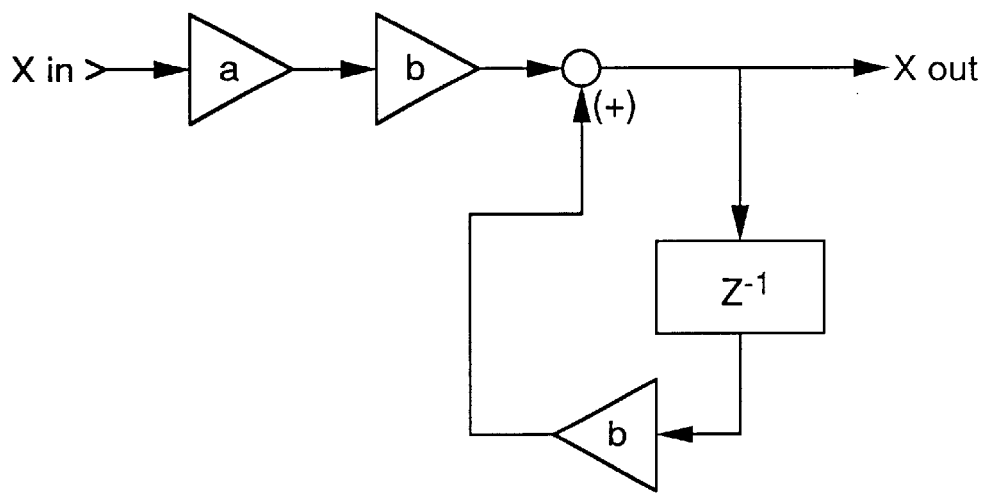
FIG. 5 is a diagram of the primary low pass filter extended on the Z plane.
Figure 6:
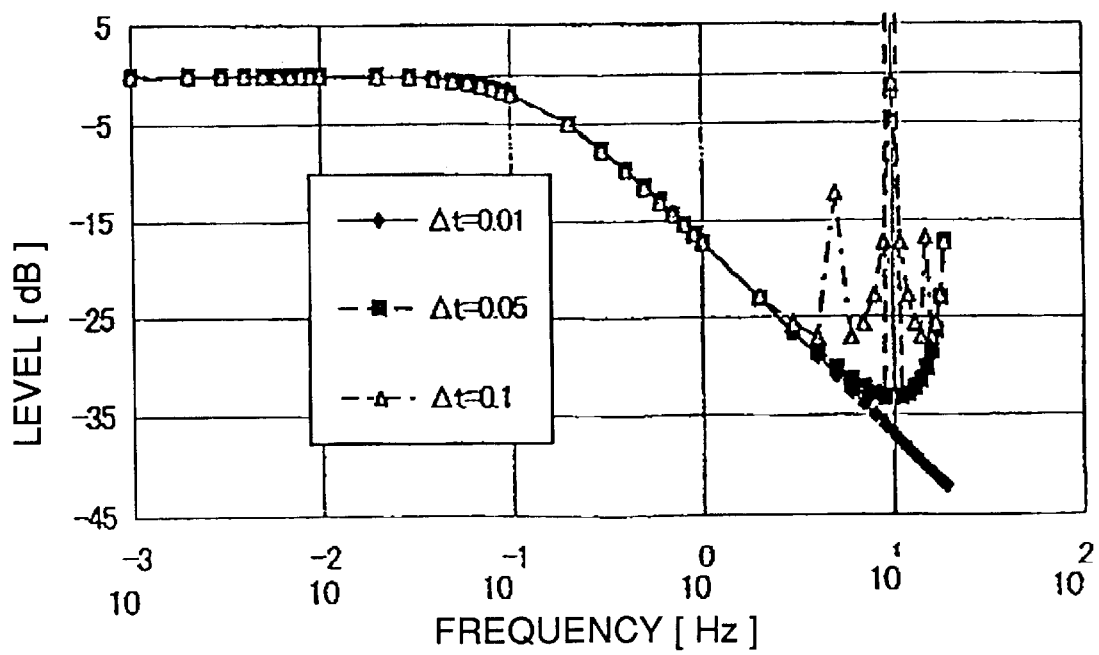
FIG. 6 shows a frequency response characteristic of the primary low pass filter extended on the Z plane.
Figure 7:
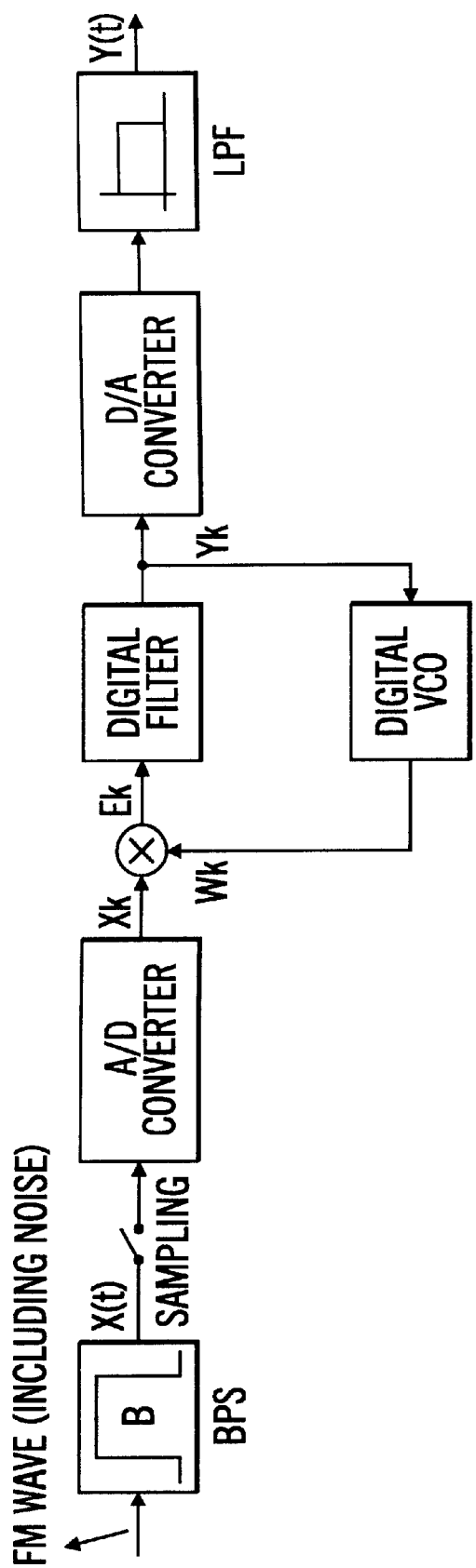
FIG. 7 is a block circuit diagram showing a conventional digital PLL.

FIG. 3 shows a construction of the integrator 4-7.

The transfer characteristic of the integrator is expressed by the following equation.

$$Y(S)=1/S \quad (7)$$

When it is extended on the Z plane, the characteristic can be rewritten as, $$Y(Z)=\Delta t/(1-Z^{-1}) \quad (8)$$

The secondary type PLL is capable of operating such that the delay element performs corresponding to $\Delta t$ for the random time information by using $\Delta t$ as an operator for the integrator 4-7 by calculating $\Delta t$ from the time difference between the present count T(i) and the preceding count T(i−1).

As hereinabove described, the present invention is effective in providing a PLL device having a fixed jitter suppression characteristic, by using Δt obtained from the difference between the present count value T(i) and the preceding count value T(i−1) as the operator for each constituting element for enabling the delay element to operate coping with random time information.

What is claimed is:

1. A PLL at a receiving side of a transfer system, wherein the transfer system has a transmitting side for counting a standard clock and reading the counted value at a random time interval and transmitting read time information including the counted value to a receiving side, wherein, in the receiving side, the standard clock is reproduced by a voltage controlled oscillator, and the reproduced clock is counted such that, by using a count value from the reproduced clock and the time information, the reproduced clock has a synchronized phase with the standard clock, wherein said PLL comprises:

a differential time calculator for calculating a differential time at the receiving side;

a primary low pass filter or an integrator using said differential time as an operator.

2. A PLL according to claim 1, wherein the PLL at the receiving side comprises:

a receiving counter, which has the same structure as a counter at the transmitting side, for counting the reproduced clock;

a subtractor, which reads the counted value of the receiving counter whenever the counted value of the transmitting side is transmitted to the receiving side, for comparing between the counted value transmitted and the counted value of the receiving counter;

said differential time calculator for calculating said differential time between a present counted value and a preceding counted value of the receiving counter;

a first attenuator for attenuating an output of the subtractor;

a second attenuator for attenuating an output of the first attenuator;

an adder for adding the output of the first attenuator and an output of an integrator;

a converter for converting an output of the adder into a voltage signal;

said voltage controlled oscillator for receiving said voltage signal and converting it into the reproduced clock for outputting into the receiving counter.

3. A PLL according to claim 2, wherein the integrator integrates the output of the second attenuator based on the differential time calculated by the differential time calculator.

4. A PLL according to claim 1, wherein said PLL comprises:

a receiving counter, which has the same structure as a counter at the transmitting side, for counting the reproduced clock;

a subtractor, which reads a counted value of the receiving counter whenever the counted value from the transmitting side is transmitted to the receiving side, and for comparing between the counted value transmitted and the counted value of the receiving counter;

said differential time calculator for calculating said differential time between a present counted value and a preceding counted value of the receiving counter;

a primary low pass filter for inputting an output of said subtractor and an output of said differential time calculator;

a first attenuator for attenuating an output of the primary low pass filter;

a second attenuator for attenuating an output of the first attenuator;

an adder for adding the output of the first attenuator and an output of an integrator;

a converter for converting an output of the adder into a voltage signal;

said voltage controlled oscillator for receiving said voltage signal and converting it into the reproduced clock for outputting into the receiving counter.

5. A PLL according to claim 4, wherein the integrator integrates the output of the second attenuator based on the differential time calculated by the differential time calculator.

6. An imperfect second-order type PLL at a receiving side of a transfer system, wherein the transfer system has a transmitting side which counts a standard clock and reads the counted value at a random time interval which is shorter than a predetermined time interval T and transmits read time information including the counted value to a receiving side, wherein, in the receiving side, the standard clock is reproduced by a voltage controlled oscillator, and the reproduced clock is counted such that, by using a counted value from the reproduced clock and the time information, the reproduced clock has a synchronized phase with the standard clock, wherein said imperfect second-order PLL comprises:

a differential time calculating means for calculating a differential time between a present count value and a preceding count value; and wherein a method of reproducing the standard clock comprises:

obtaining a difference between the standard clock and the reproduced clock by comparing both clocks using a subtractor;

filtering a high frequency band in said difference using a primary low pass filter which uses the differential time as an operator;

attenuating an output of the primary low pass filter by an attenuator to provide an attenuated signal;

processing said attenuated signal to produce a processing signal;

converting the processing signal into a voltage signal; and reproducing the standard clock at the receiving side by inputting the voltage signal into the voltage controlled oscillator and feeding back the reproduced clock to a receiving counter.

7. A PLL according to claim 6, wherein said primary low pass filter comprises:

a first multiplier for multiplying an input signal Xin by a first factor a;

a second multiplier for multiplying an output of the first multiplier by a second factor b;

a delay circuit for delaying an output signal Xout for a delay time t;

a third multiplier for multiplying an output of the delay circuit by the second factor b;

an adder for adding an output of the second multiplier to an output of the third multiplier and for outputting the result as the output signal Xout;

wherein, said first factor a and the second factor b are determined based on the reciprocal of the time constant 1/RC of the delay circuit and the delay time t.

8. A PLL at a receiving side of a transfer system wherein the transfer system has a transmitting side which counts a standard clock and reads the counted value at a random time interval which is shorter than a predetermined time interval T and transmits read time information including the counted value to a receiving side, wherein, in the receiving side, the standard clock is reproduced by a voltage controlled oscillator, and the reproduced clock is counted such that, by using a count value from the reproduced clock and the time information, the reproduced clock has a synchronized phase with the standard clock, wherein said PLL comprises:

a differential time calculating means for calculating a differential time between a present count value and a preceding count value; and wherein a method of reproducing the standard clock comprises:

obtaining a difference between the standard clock and the reproduced clock by comparing both clocks using a subtractor;

filtering a high frequency band in said difference using a primary low pass filter which uses the differential time as an operator;

attenuating an output of the primary low pass filter using a first attenuator;

further attenuating an output of said first attenuator using a second attenuator;

integrating an output of said second attenuator by an integrator using the differential time as an operator;

adding the output of the first attenuator to an output of the integrator;

converting a result of the addition into a voltage signal;

reproducing the standard clock at the receiving side by inputting the voltage signal into the voltage controlled oscillator, and feeding back the reproduced clock to a receiving counter; and wherein the PLL is a perfect second-order type PLL.

9. A PLL according to claim 8, wherein said integrator comprises:

a multiplier for multiplying an input signal Xin by a delay time t;

a delay circuit for delaying an output signal Xout for the delay time t;

an adder for adding a signal which is fed back from said delay circuit and the output of said multiplier.

10. A PLL at a receiving side of a transfer system, wherein the transfer system has a transmitting side which counts a standard clock and reads the counted value at a random time interval which is shorter than a predetermined time interval T and transmits read time information including the counted value to a receiving side, wherein, in the receiving side, the standard clock is reproduced by a voltage controlled oscillator, and the reproduced clock is counted such that, by using a counted value from the reproduced clock and the time information, the reproduced clock has a synchronized phase with the standard clock, wherein said PLL comprises:

a differential time calculating means for calculating a differential time between a present count value and a preceding count value; and wherein a method of reproducing the standard clock comprises:

obtaining a difference between the standard clock and the reproduced clock by comparing both clocks using a subtractor;

filtering a high frequency band in said difference using a primary low pass filter which uses the differential time as an operator;

attenuating an output of the primary low pass filter using a first attenuator;

further attenuating an output of said first attenuator using a second attenuator;

integrating an output of said second attenuator by an integrator using the differential time as an operator;

adding the output of the first attenuator to an output of the integrator;

converting a result of the addition into a voltage signal;

reproducing the standard clock at the receiving side by inputting the voltage signal into the voltage controlled oscillator, and feeding back the reproduced clock to a receiving counter; and wherein said PLL is an imperfect third-order type PLL.

11. A PLL at a receiving side of a transfer system, wherein the transfer system has a transmitting side which counts a standard clock and which reads counted values at a random time interval which is less than a predetermined time interval T and which transmits read time information to the receiving side, and wherein, at the receiving side, the standard clock is reproduced by a voltage controlled oscillator, which is synchronized with a phase of the standard clock by counting the received standard clock and by using the read time information, wherein said PLL comprises:

a differential time calculator for calculating a differential time between a present time and a preceding time at the receiving side;

a primary low pass filter or an integrator using said differential time as an operator;

a receiving counter, which has the same structure as that of a counter at the transmitting side, and which counts the received standard clock;

a subtractor, which reads the counted value of the receiving counter whenever the counted value of the transmitting side is transmitted to the receiving side, for comparing between the counted value transmitted and the counted value of the counter at the receiving side;

said differential time calculator for calculating said differential time between a present counted value and a preceding counted value of the receiving counter;

a first attenuator;

a second attenuator for further attenuating an output of the first attenuator;

an adder for adding the output of the first attenuator and an output of an integrator;

a converter for converting an output of the adder into a voltage signal; and a voltage controlled oscillator which inputs the voltage signal of the converter and outputs a controlled signal to the receiving counter.

12. A PLL according to claim 11, wherein said primary low pass filter is disposed between said subtractor and said integrator which receives the output of said subtractor and said differential time calculator and which provides an output to said first attenuator.

13. A PLL according to claim 11, wherein said primary low pass filter comprises:

a first multiplier for multiplying an input signal Xin by a first factor a;

a second multiplier for multiplying an output of the first multiplier by a second factor b;

a delay circuit for delaying an output signal Xout by a delay time $\Delta t$;

a third multiplier for multiplying an output of the delay circuit by the second factor b;

an adder for adding an output of the second multiplier and an output of the third multiplier and for outputting an output of the adder as the output signal Xout;

wherein, said first factor a and the second factor b are determined based on the reciprocal of the time constant 1/RC of the circuit and the delay time Δt.

14. A PLL according to claim 11, wherein said integrator comprises:

a multiplier for multiplying an input signal Xin by a delay time Δt;

a delay circuit for delaying an output signal Xout for the delay time Δt;

an adder for adding a signal which is fed back from said delay circuit and an output of said multiplier.

15. A method of reproducing a standard clock in an imperfect second-order type PLL, which is at a receiving side of a transfer system, wherein the transfer system has a transmitting side which counts a standard clock and reads a count value at a random time interval which is shorter than a predetermined time interval T, and which transmits the count value and time information thereof to the receiving side, wherein the standard clock is reproduced at the receiving side by a voltage control oscillator, and wherein the reproduced standard clock is synchronized with the standard clock from the transmitting side by using the reproduced standard clock and the time information, wherein the imperfect second-order type PLL has a differential time calculator for calculating a differential time between a present counted value and a previous counted value, the method comprising the steps of:

obtaining a difference between the standard clock at the transmitting side and the reproduced standard clock at the receiving side by comparing using a subtractor;

filtering a high frequency component of said difference by a primary low pass filter which uses the differential time as an operator;

attenuating said output of the primary low pass filter by an attenuator to provide an attenuated signal;

processing said attenuated signal to produce a processing signal;

converting the processing signal into a voltage signal; and reproducing the standard clock at the receiving side by inputting the voltage signal into the voltage controlled oscillator, and feeding back the reproduced standard clock to a receiving standard counter.

16. A method of reproducing a standard clock in a perfect second-order type PLL, which is at a receiving side of a transfer system, wherein the transfer system has a transmitting side which counts a standard clock and reads a counted value at a random time interval which is shorter than a predetermined time interval T, and transmits time information to the receiving side, wherein, at the receiving side, the standard clock is reproduced by a voltage control oscillator, and the reproduced standard clock is counted in a synchronized phase with the standard clock of the transmitting side by counting the reproduced standard clock and by using a counted value and the time information, wherein said perfect second-order type PLL has a differential time calculator for calculating a differential time between a present count value and a preceding count value; and wherein the method of reproducing the standard clock comprises the steps of:

obtaining a difference between the standard clocks at the transmitting side and the receiving side by comparing both standard clocks using a subtractor;

attenuating said difference with a first attenuator;

further attenuating an output of said first attenuator with a second attenuator;

integrating an output of said second attenuator with an integrator which uses the differential time as an operator;

adding the output of the first attenuator and an output of the integrator;

converting a result of the addition into a voltage signal; and reproducing the standard clock at the receiving side by inputting the voltage signal into the voltage control oscillator, and feeding back the reproduced standard clock to a receiving standard counter.

17. A method of reproducing a standard clock in a third-order type PLL, which is at a receiving side of a transfer system, wherein the transfer system has a transmitting side which counts a standard clock and reads a counted value at a random time interval which is shorter than a predetermined time interval T, and which transmits time information to the receiving side, wherein at the receiving side, the standard clock is reproduced by an voltage control oscillator, and the reproduced standard clock is counted in a synchronized phase with the standard clock of the transmitting side by counting the reproduced standard clock and by using a counted value and the time information, wherein the third-order type PLL has a differential time calculator for calculating between a present count value and a preceding count value; and wherein the method of reproducing the standard clock comprising the steps of:

obtaining a difference between the standard clocks at the transmitting side and the receiving side by comparing both standard clocks using a subtractor;

filtering a high frequency band in said difference by a primary low pass filter which uses the differential time as an operator;

attenuating an output of the primary low pass filter with a first attenuator;

further attenuating an output of said first attenuator with a second attenuator;

integrating an output of said second attenuator with an integrator using the differential time as an operator;

adding the output of the first attenuator and an output of the integrator;

converting a result of the adding step into a voltage signal; and reproducing the standard clock at the receiving side by inputting the voltage signal into into the voltage control oscillator, and feeding back the reproduced standard clock to the receiving standard counter.

* * * * *